United States Patent
Yang et al.

(10) Patent No.: US 11,359,840 B2
(45) Date of Patent: Jun. 14, 2022

(54) SYSTEMS AND METHODS FOR PHOTOTHERMAL MATERIAL

(71) Applicant: UCHICAGO ARGONNE, LLC, Chicago, IL (US)

(72) Inventors: Hao-Cheng Yang, Westmont, IL (US); Seth B. Darling, Chicago, IL (US); Yunsong Xie, Naperville, IL (US); Zhaowei Chen, Downers Grove, IL (US); Jeffrey W. Elam, Elmhurst, IL (US)

(73) Assignee: UChicago Argonne, LLC, Chicago, IL (US)

( * ) Notice: Subject to any disclaimer, the term of this patent is extended or adjusted under 35 U.S.C. 154(b) by 339 days.

(21) Appl. No.: 16/053,323

(22) Filed: Aug. 2, 2018

(65) Prior Publication Data

US 2020/0041169 A1 Feb. 6, 2020

(51) Int. Cl.
| | | |
|---|---|---|
| *F24S 70/20* | (2018.01) | |
| *C23C 16/455* | (2006.01) | |
| *C23C 16/40* | (2006.01) | |
| *C02F 1/44* | (2006.01) | |
| *B01D 67/00* | (2006.01) | |
| *F24S 70/65* | (2018.01) | |
| *B01D 61/36* | (2006.01) | |
| *F24S 80/00* | (2018.01) | |
| *C02F 101/12* | (2006.01) | |
| *C02F 103/08* | (2006.01) | |

(52) U.S. Cl.
CPC .......... *F24S 70/20* (2018.05); *B01D 61/364* (2013.01); *B01D 67/0072* (2013.01); *C02F 1/447* (2013.01); *C23C 16/40* (2013.01); *C23C 16/405* (2013.01); *C23C 16/45527* (2013.01); *C23C 16/45553* (2013.01); *F24S 70/65* (2018.05); *B01D 2323/36* (2013.01); *C02F 2101/12* (2013.01); *C02F 2103/08* (2013.01); *F24S 2080/011* (2018.05); *F24S 2080/014* (2018.05)

(58) Field of Classification Search
None
See application file for complete search history.

(56) References Cited

U.S. PATENT DOCUMENTS

| | | | | |
|---|---|---|---|---|
| 2002/0022672 A1* | 2/2002 | Thunhorst | ................ | C08J 9/283 521/50.5 |
| 2005/0230665 A1* | 10/2005 | Thompson | .......... | H01L 51/0053 252/500 |
| 2011/0210282 A1* | 9/2011 | Foley | .................... | B82Y 25/00 252/62.51 R |

(Continued)

FOREIGN PATENT DOCUMENTS

JP 2011113936 A * 6/2011

OTHER PUBLICATIONS

Takeuchi, Y, Photothermal Conversion Sheet, Jun. 9, 2011, machine translation of JP2011-113936 (Year: 2011).*

(Continued)

*Primary Examiner* — Chinessa T. Golden
(74) *Attorney, Agent, or Firm* — Foley & Lardner LLP

(57) ABSTRACT

Chinese ink is applied on various materials and stabilized by atomic layer deposition to fabricate solar steam generation devices. The encapsulated ink has excellent photothermal properties and evaporation efficiency under simulated sunlight, holding great promise in solar evaporation device applications.

8 Claims, 4 Drawing Sheets

(56) References Cited

U.S. PATENT DOCUMENTS

2011/0281150 A1* 11/2011 Yong ............... H01M 2/166
429/144

OTHER PUBLICATIONS

Bandura, et al., "Derivation of Force Field Parameters for SnO2—H2O Surface Systems from Plane-Wave Density Functional Theory Calculations," Journal of Physical Chemistry B 110(16), pp. 8386-8397 (2006).
Chen, et al., "Highly Flexible and Efficient Solar Steam Generation Device," Advanced Materials 29(30), 1701756, 8 pages (2017).
Deng, et al., "The emergence of solar thermal utilization: solar-driven steam generation," Journal of Materials Chemistry A 5, pp. 7691-7709 (2017).
Hu, et al., "Tailoring Graphene Oxide-Based Aerogels for Efficient Solar Steam Generation under One Sun," Advanced Materials 29(5), 1604031 (2017).
Ito, et al., "Multifunctional Porous Graphene for High-Efficiency Steam Generation by Heat Localization," Advanced Materials 27(29), pp. 4302-4307 (2015).
Jiang, et al., "Wood-Based Nanotechnologies toward Sustainability," Advanced Materials 30(1), 1703453, 39 pages (2018).
Kushita & Hojou, "In situ EELS observation of graphite structure modification due to hydrogen ion irradiation," Ultramicroscopy 35(3-4), pp. 289-293 (1991).
Li, et al., "3D-Printed, All-in-One Evaporator for High-Efficiency Solar Steam Generation under 1 Sun Illumination," Advanced Materials 29(26), 1700981 (2017).
Li, et al., "Graphene oxide-based efficient and scalable solar desalination under one sun with a confined 2D water path," Proceedigns of the National Academy of Sciences 113(49), pp. 13953-13958 (2016).
Li, et al., "MXene Ti3C2: An Effective 2D Light-to-Heat Conversion Material," ACS Nano 11(4), pp. 3752-3759 (2017).
Lin, et al., "Integrative solar absorbers for highly efficient solar steam generation," Journal of Materials Chemistry A 6, pp. 4642-4648 (2018).
Liu, et al., "A Bioinspired, Reusable, Paper-Based System for High-Performance Large-Scale Evaporation," Advanced Materials 27(17), pp. 2768-2774 (2015).
Liu, et al., "Floatable, Self-Cleaning, and Carbon-Black-Based Superhydrophobic Gauze for the Solar Evaporation Enhancement at the Air-Water Interface," ACS Applied Materials & Interfaces 7(24), pp. 13645-13652 (2015).
Liu, et al., "Wood-Graphene Oxide Composite for Highly Efficient Solar Steam Generation and Desalination," ACS Applied Materials & Interfaces 9(8), pp. 7675-7681 (2017).
Ren, et al., "Hierarchical Graphene Foam for Efficient Omnidirectional Solar-Thermal Energy Conversion," Advanced Materials 29(38), 1702590 (2017).
Shi, et al., "A 3D Photothermal Structure toward Improved Energy Efficiency in Solar Steam Generation," Joule 2(6), pp. 1171-1186 (2018).
Wang, "Emerging investigator series: the rise of nano-enabled photothermal materials for water evaporation and clean water production by sunlight," Environmental Science: Nano 5, pp. 1078-1089 (2018).
Wang, et al., "Chinese Brushes: Controllable Liquid Transfer in Ratchet Conical Hairs," Advanced Materials 26(28), pp. 4899-4894 (2014).
Wang, et al., "Chinese ink: High performance nanofluids for solar energy," Solar Energy Materials and Solar Cells 176, pp. 374-380 (2018).
Wang, et al., "Graphene-based Recyclable Photo-Absorbers for High-Efficiency Seawater Desalination," ACS Applied Materials & Interfaces 8(14), pp. 9194-9199 (2016).
Wang, et al., "High-Performance Photothermal Conversion of Narrow-Bandgap Ti2O3 Nanoparticles," Advanced Materials 29(3), 1603730, 6 pages (2017).
Wang, et al., "Improved light-harvesting and thermal management for efficient solar-driven water evaporation using 3D photothermal cones," Journal of Materials Chemistry A 6(21), pp. 9874-9881 (2018).
Wang, et al., "Improved light-harvesting and thermal management for efficient solar-driven water evaporation using 3D photothermal cones," Journal of Materials Chemistry A 6, pp. 9874-9881 (2018).
Wang, et al., "Self-Floating Carbon Nanotube Membrane on Macroporous Silica Substrate for Highly Efficient Solar-Driven Interfacial Water Evaporation," ACS Sustainable Chemistry & Engineering 4(3), pp. 1223-1230 (2016).
Wang, et al., "Solar steam generation through bio-inspired interface heating of broadband-absorbing plasmonic membranes," Applied Energy 195, pp. 414-425 (2017).
Wei, et al., "Identification of the materials used in an Eastern Jin Chinese ink stick," Journal of Cultural Heritage 13(4), pp. 448-452 (2012).
Xu, et al., "Mushrooms as Efficient Solar Steam-Generation Devices," Advanced Materials 29(28), 1606762 (2017).
Xue, et al., "Robust and Low-Cost Flame-Treated Wood for High-Performance Solar Steam Generation," ACS Applied Materials & Interfaces 9(17), pp. 15052-15057 (2017).
Yang, et al., "Graphene-Based Standalone Solar Energy Converter for Water Desalination and Purification," ACS Nano 12(1), pp. 829-835 (2018).
Yuan, et al., "Multifunctional Stiff Carbon Foam Derived from Bread," ACS Applied Materials & Interfaces 8(26), pp. 16852-16861 (2016).
Zhang, et al., "Plasmonic heating from indium nanoparticles on a floating microporous membrane for enhanced solar seawater desalination," Nanoscale 9, pp. 12843-12849 (2017).
Zhou, et al., "3D self-assembly of aluminium nanoparticles for plasmon-enhanced solar desalination," Nature Photonics 10, pp. 393-398 (2016).
Zhou, et al., "Self-assembly of highly efficient, broadband plasmonic absorbers for solar steam generation," Science Advances 2(4), e1501227, 8 pages (2016).
Zhu, et al., "Tree-Inspired Design for High-Efficiency Water Extraction," Advanced Materials 29(44), 1704107, 9 pages, (2017).
Li, et al., "Processable aqueous dispersions of graphene nanosheets," Nature Nanotechnology 3, pp. 101-105 (2008).
Liu, et al., "Solar water evaporation by black photothermal sheets," Nano Energy 41, pp. 269-284 (2017).

* cited by examiner

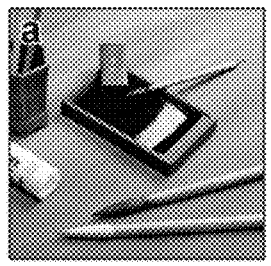 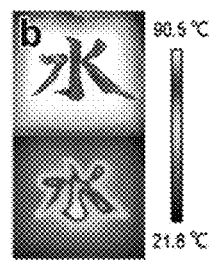
FIG. 1A    FIG. 1B
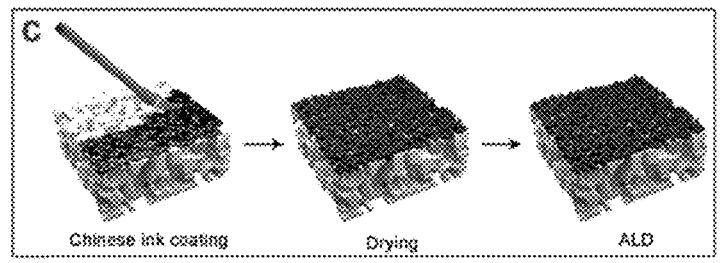
FIG. 1C
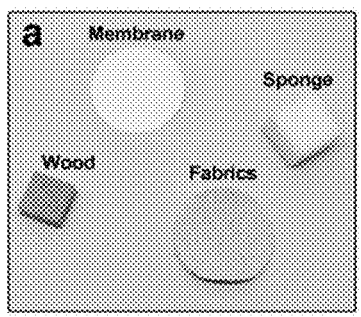 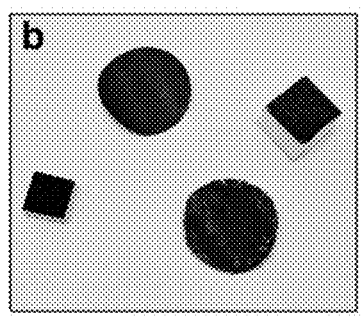 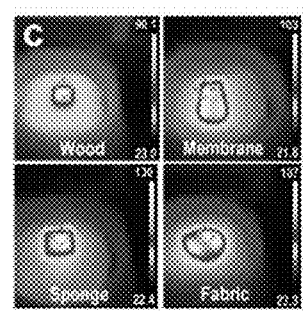
FIG. 2A    FIG. 2B    FIG. 2C
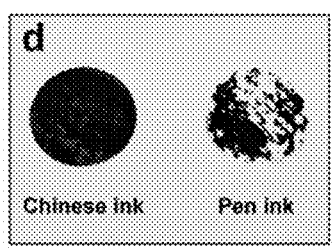 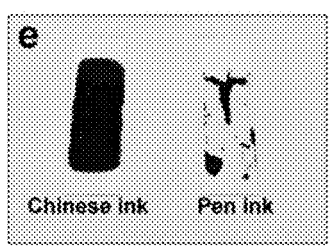 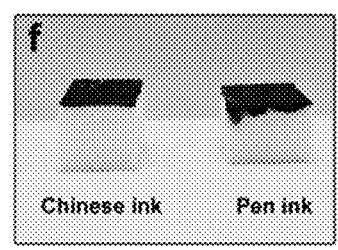
FIG. 2D    FIG. 2E    FIG. 2F

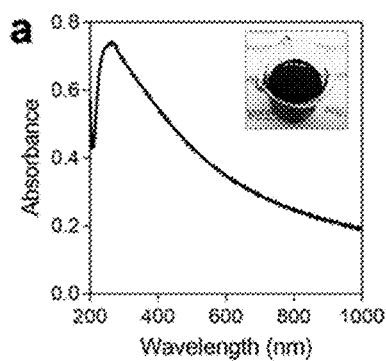
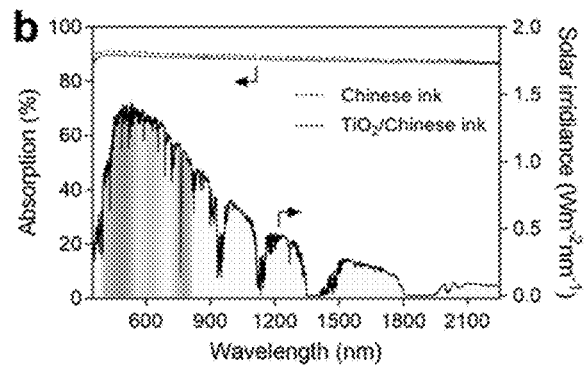
FIG. 5A
FIG. 5B
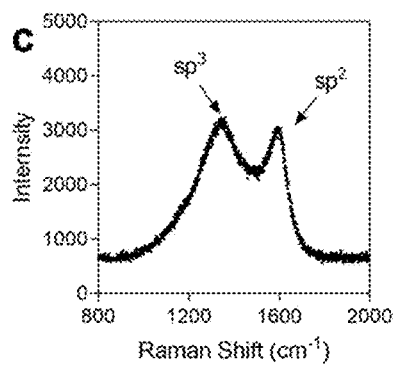
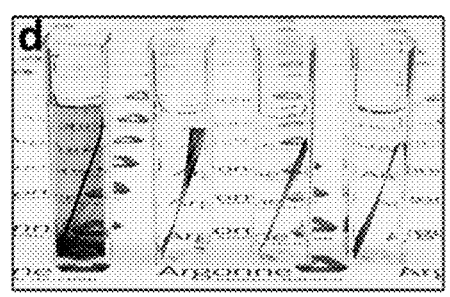
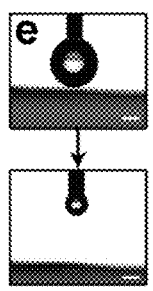
FIG. 5C
FIG. 5D
FIG. 5E
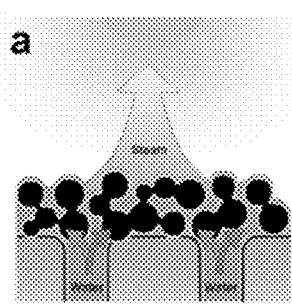
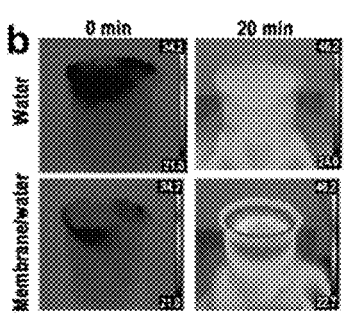
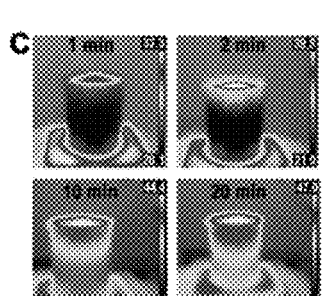
FIG. 6A
FIG. 6B
FIG. 6C
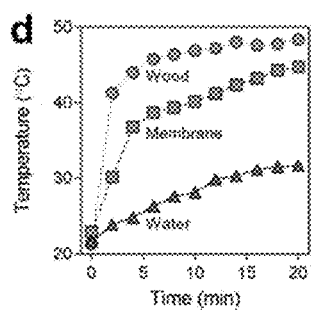
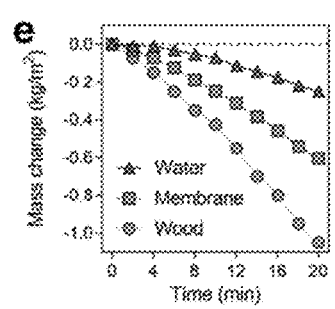
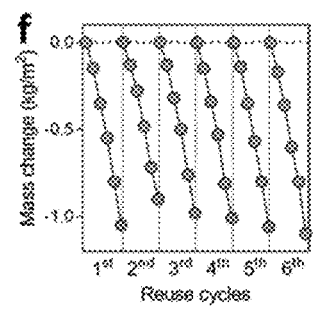
FIG. 6D
FIG. 6E
FIG. 6F

SYSTEMS AND METHODS FOR PHOTOTHERMAL MATERIAL

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to photothermal material, more specifically to a carbon-based ink fixed by an ALD deposited coating.

BACKGROUND

Providing sources of freshwater is a challenge in many countries throughout the world due to both short term and long term constraints on the fresh water supply. Freshwater shortage is among the biggest challenges in many populated regions of the world. For many countries and locales with access to the ocean, acquiring fresh water from seawater has been regarded as a promising strategy to ease the freshwater crisis because the ocean holds nearly 97% of the water resource on the earth. Desalinization technologies have been the focus of intense research for many decades. Large-scale desalination largely focuses on multi-stage flash and reverse osmosis. Thus, these technologies have reached a level of maturity and broad-based acceptance.

However, these technologies present their own issues. Perhaps foremost among those issues is the vast amount of energy necessary. Thus, the reliance on such desalination technologies requires a difficult choice between water and energy. Solar energy is a clean and abundant renewable energy source. It is attractive to directly use solar energy for seawater-to-freshwater conversion through the utilization of photothermal materials. The barrier to ease of use of solar energy for desalination has been the lack of an efficient, effective, cheap, and abundant photothermal material Conventional photothermal materials can be categorized into carbon materials, plasmonic metals, and semiconducting materials. Of those, carbon materials show the significant advantages of ultra-high solar absorbance, good stability, low cost, and abundance. Well-known carbon materials, such as graphene and carbon nanotubes, have been fabricated into films, foams, or sponges and then applied in solar steam generation, but the economic scalability for these materials is unclear, particularly for wide scale use or adoption in remote or resource-poor locations. Some common carbon sources (like bread, wood, mushrooms, and sponges) have also been implemented in light-to-heat conversion after carbonization. Improvement in photothermal efficiency will be necessary to enable practical, large-scale applications, and development of alternative carbon-based materials is a promising pathway.

While many advanced carbon-based nanomaterials have been created, there exists ancient materials that modern science has identified as also being such carbon-based nanomaterials. For example, Chinese ink is a carbon-based nanomaterial invented by the ancient Chinese thousands of years ago, playing a crucial role in the long history of Chinese painting and calligraphy (see FIG. 1A). Traditional Chinese ink is made of soot, animal glue, and other additives. It has merits as a painting material, such as uniform dispersion in water, strong adhesion to material surfaces, and long-term stability in both water and air. Because the nature of soot is carbon nanoparticles originating from incomplete combustion of wood, Chinese ink is also an outstanding carbon-based photothermal material. FIG. 1B shows an example demonstrating such thermal properties. In the example of FIG. 1B, the surface temperature of characters written in Chinese ink will increase rapidly to nearly 90° C. within 30 seconds under one sun irradiation (FIG. 1B). It has been reported dispersed Chinese ink showed superior photothermal performance to copper nanoparticles, copper oxide nanoparticles, and even carbon black. However, dispersed ink solutions perform with relatively low evaporation efficiency because, in the case of a dispersed system, the entire container of water is heated under solar irradiation, while the evaporation only happens at the surface. Dispersed ink systems also are not functional in flowing water or natural water systems, such as rivers and lakes, and may also require an additional removal step prior to providing potable freshwater. A large portion of heat dissipates through thermal radiation from the bulk water. Therefore, interfacial photothermal materials are highly preferred, since they isolate the light-to-heat conversion specifically at the air/water interface where it is needed. Further, many ink solutions tends to de-wet from substrates with low surface energy, causing adhesion problems and reducing the usability of the coated product.

Thus there is a need for a photothermal material that exhibits beneficial properties seen in some existing materials, such as Chinese ink, but without the drawbacks, such as associated with a dispersed system or exposed nanomaterials. Therefore, there is unmet demand for photothermal materials that provide a cheap, environmentally friendly structure such as for steam generation.

SUMMARY

Some embodiments described herein relate generally to a method of fabricating photothermal material. The method comprises fabricating an photothermal membrane by: applying a nanocarbon material to a porous substrate; forming a solid nanocarbon layer on the membrane; depositing an oxide coating on the nanocarbon layer atomic layer deposition. The ALD deposition is by X cycles of performing A atomic layer deposition subcycles of a first ALD precursor at a first deposition temperature; and performing B atomic layer deposition subcycles of a second ALD precursor at a second deposition temperature, where X is greater than 0, A is greater than 0, and B is greater than 0.

Another embodiment relates to a photothermal membrane. The photothermal membrane comprises a bulk membrane having a porous network and comprising a bulk material having a hydrophilic moiety selected from the group consisting of polyvinylidene fluoride ("PVDF"), polypropylene ("PP"), polyethylene ("PE"), polytetrafluoroethylene ("PTFE"), nylon, cellulose acetate ("CA"), polyacrylonitrile ("PAN"), polycarbonate ("PC"), polyether etherketone ("PEEK"), polyimide ("PI"), polysulfone ("PS"), and polyethersulfone ("PES"). A photothermal carbon coating is deposited on the membrane. An oxide coating is conformally disposed on the photothermal carbon coating, the oxide coating selected from the group consisting of $TiO_2$, $SnO_2$, $HfO_2$, $ZrO_2$, $SiO_2$, and $In_2O_3$.

Another embodiment relates to a photothermal heating device. The device has a substrate with a porous network and comprising a bulk material. The device further includes a photothermal carbon coating deposited on the substrate, the phototermal carbon coating comprising a nanocarbon material and an adhesive. An oxide coating is conformally disposed on the photothermal carbon coating, the oxide coating selected from the group consisting of $TiO_2$, $SnO_2$, $HfO_2$, $ZrO_2$, $SiO_2$, and $In_2O_3$.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 1A shows prior art Chinese ink and writing brush, similar to those used for writing and drawing for over two thousand years. FIG. 1B is a digital (top) and infrared (bottom) images of the Chinese character "water" written in Chinese ink under simulated sunlight. FIG. 1C shows one embodiment of a scheme for the fabrication process for ALD/Chinese ink-coated materials.

FIG. 2A shows a digital pictures of various materials (i.e., wood, membrane, fabric, and sponge) before coating with Chinese ink. FIG. 2B shows the materials of FIG. 2A after being painted by Chinese ink. FIG. 2C shows infrared images of Chinese ink-coated materials under simulated sunlight. FIG. 2D is a comparison of Chinese ink and pen ink on polypropylene membranes, FIG. 2E is a comparison of Chinese ink and pen ink on glass slides, and FIG. 2F is a comparison of Chinese ink and pen ink on melamine sponges.

FIG. 4A: 0 ALD cycles; FIG. 4B: 10 ALD cycles; FIG. 4C: 20 ALD cycles; FIG. 4D: 40 ALD cycles.

FIG. 5A is a graph of UV-vis spectrum of a photothermal carbon ink solution. FIG. 5B is a graph of UV-vis/NIR spectra of photothermal carbon-ink-coated and ALD/photothermal carbon-ink-coated membranes and the AM1.5 standard sunlight spectrum for comparison. FIG. 5C is a Raman spectrum of the photothermal carbon ink coating. FIG. 5D is a photograph illustrating water stability of photothermal carbon-ink-coated membranes with $TiO_2$ ALD layers (the ALD number is 0, 10, 20, and 40 from left to right). FIG. 5E illustrates a water drop permeating through the ALD/photothermal carbon-ink-coated membrane rapidly (scale bar is 0.5 mm).

FIG. 6A shows one embodiment of a mechanism of water evaporation through the ALD/photothermal carbon-ink-coated membrane. FIG. 6B is a series of infrared images of beakers with and without ALD/photothermal carbon-ink-coated membrane before and after simulated sunlight irradiation. FIG. 6C is a series of images of temperature distribution and evolution of ALD/photothermal carbon-ink-coated wood in water. The thermal error bar is 0.95° C. FIG. 6D is a graph of temperature evolution. FIG. 6E is a graph of mass change of beakers with water, water/membrane, and water/wood. FIG. 6F is a graph showing reusability of ALD/photothermal carbon-ink-coated wood in solar evaporation.

Figure 3A:
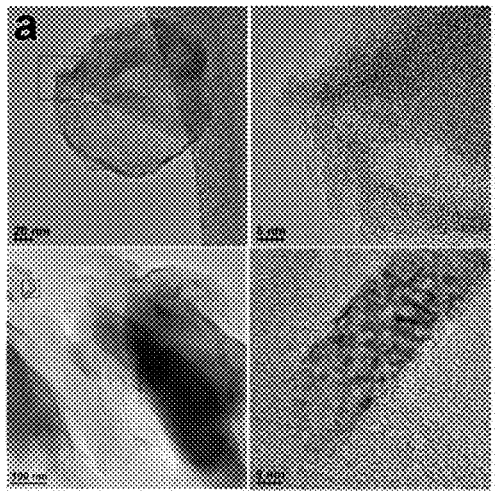
FIG. 3A shows TEM images (indicated boxes denote regions depicted in the higher-magnification images)

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to photothermal materials. As further described herein the photothermal materials may be fabricated by ALD.

Described herein are embodiments relating to a method and system for fabricating photothermal coatings on various substrates and methods and articles of manufacture utilizing the same. The photothermal coatings include a carbon nanomaterial, such as one based on Chinese ink coating, stabilized with a covalently bonded atomic layer coating, such as oxide coatings deposited by ALD. FIG. 1C illustrates an embodiment wherein photothermal carbon ink carbon nanomaterial is deposited and coated by an oxide via ALD. The ALD coating can act as a "glue" to integrate photothermal carbon ink with the substrates and prevent the ink re-dispersing into the water, which may cause secondary pollution and require additional energy input for recycling. Moreover, the ALD coating may be selected to provide different properties from those native to the carbon nanomaterial, such as hydrophilicity ALD to facilitate water transport into an associated porous substrate through enhanced capillary action. In such an embodiment, the hydrophilicity ensuring a water supply to the surface during evaporation.

In a general fabrication process illustrated in FIG. 1C, photothermal carbon ink is coated on a substrate using a writing brush (or other coating tool) as well as advanced coating techniques such as spin-coating, dip-coating, and spray coating. The coating thickness is controlled by the ink used. After drying in air, the photothermal carbon-ink-coated materials are transferred into a vacuum ALD reactor and deposited with a thin layer of oxide. In one example embodiment, $TiO_2$ is selected as the coating material because of its good stability in water and hydrophilicity compared with other oxides, as well as the relatively low ALD temperature enabling its application on polymer substrates with poor thermal stability. As further described below regarding experimental examples, the prepared materials show excellent photothermal properties (with a surface temperature above 90° C.) under the irradiation of simulated sunlight, and the differences in surface temperature are the result of their intrinsic physical properties (FIG. 2C). For example, the sponge shows the highest surface temperature because nearly 99% of the material is occupied by air, which is insulated good insulator, while the wood temperature is relatively low due to its high specific heat.

Embodiments herein describe the use of "Chinese ink" as a component. As used herein, traditional Chinese ink is a coating of soot and adhesive and may include additional materials such as aromatics to provide traditional ink with a scent. Described herein is a photothermal carbon ink comprising nanocarbon material and an adhesive. The photothermal carbon ink is capable of drying to form a photothermal carbon coatings. Thus, photothermal carbon coatings may be provided in a liquid form suspended to coat a material, drying to leave the coating.

The black color of traditional Chinese ink originates from the carbon soot, which plays a dominant role in light-to-heat conversion observed in the Chinese ink samples. The carbon nanomaterial of the photothermal carbon ink is produced by incomplete composition of organic material, in certain embodiments, wood, coal and/or hydrocarbons. The nanocarbon material, in one embodiment, is selected from graphitic nanoparticles, such as 100 nm to 500 nm amorphous carbon, graphene platelets, such as 100 nm to 500 nm, and a combination thereof. In one embodiment, a wide distribution of nanoparticle and nanoplatelet sizes is preferred.

Figure 3B:
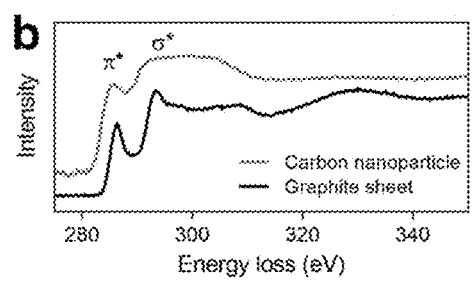
FIG. 3B shows electron energy-loss spectra ("EELS") of Chinese ink, composed of amorphous carbon nanoparticles and graphitic sheets.
Figure 7:
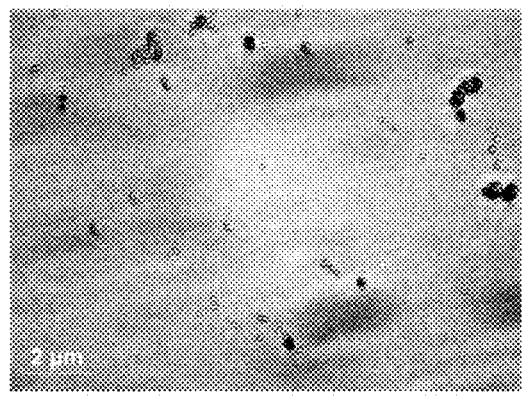
FIG. 7 shows an optical microscopic image of diluent photothermal carbon ink on glass slide.
Figure 8:
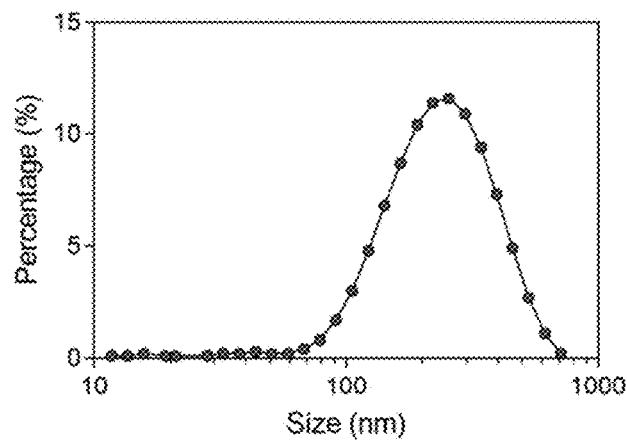
FIG. 8 is a graph of size distribution of carbon nanoparticles in a ink detected by dynamic light scattering.
Figure 9:
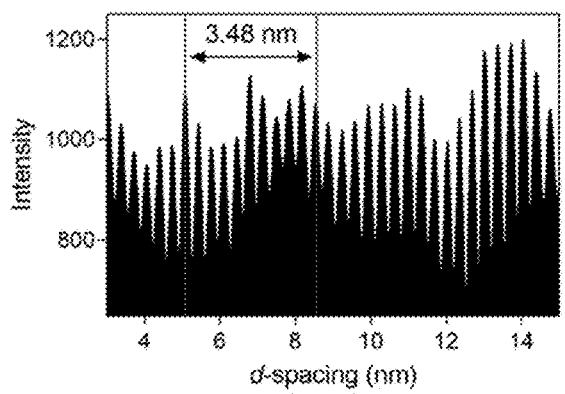
FIG. 9 illustrates d-spacing of graphite structure in photothermal carbon ink.
Figure 10:
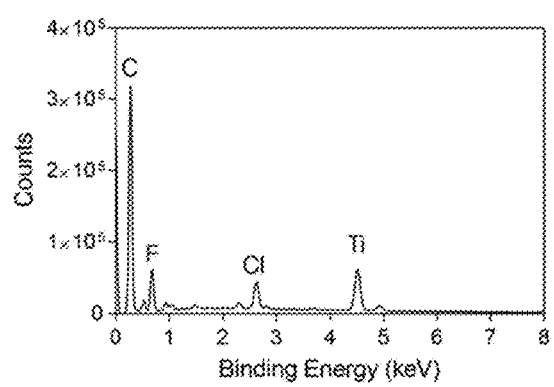
FIG. 10 is an EDS spectrum of ALD/ink-coated membrane.
Figure 11:
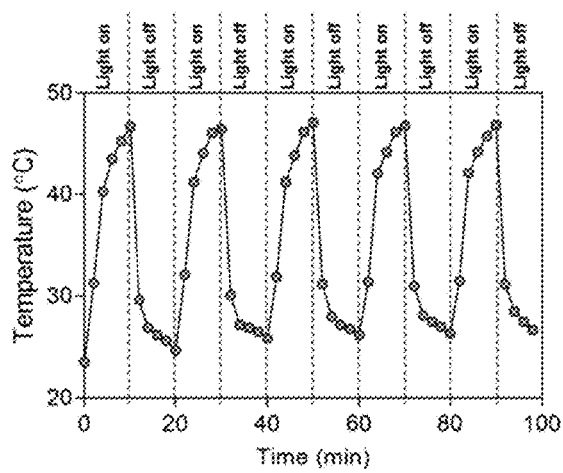
FIG. 11 is a graph of temperature evolution of the ALD/-ink-coated wood floating on the water with/without sunlight irradiation.

To investigate the properties of these carbon nanomaterials, their structures were observed by a high-resolution transmission electron microscope ("TEM"), as shown in FIG. 3A. Both carbon nanoparticles and carbon nanoplatelets were observed. The carbon nanoparticles are primarily amorphous, with a few small ordered regions near the particle surfaces. The diameter of these nanoparticles is around 100 nm under TEM observation, while the size measured by dynamic light scattering and optical microscope observation is somewhat larger, around 250 nm (FIGS. 7 and 8), due to aggregation in solution. Graphite-like regions were observed within the carbon nanoplatelets. The interlamellar distance was about 3.5 Å, in accordance with the interlayer spacing of graphene (FIG. 9). Additional structural information was acquired from electron energy-loss spectroscopy (FIG. 3B). The first peak at 286 eV is induced by transitions to the $\pi^*$ molecular orbital due to the presence of $sp^2$ bonding, while the second at 294 eV arises from the transitions to $\sigma^*$ orbitals. The features of these peaks correspond to amorphous carbon and graphite, respectively. This diversity of carbon nanomaterials broadens the overall light absorption envelope of the photothermal ink solution and coating.

The adhesive in photothermal carbon ink plays a crucial role in regulating the viscosity for fluid writing and providing strong adhesion between the ink and substrates. The adhesive may be selected from the group consisting of carrageenan and gelatin. In one embodiment, the adhesive is gelatin. In one embodiment, an animal-based adhesive is utilized. In one embodiment, optical dopants are added to alter the absorption properties, such as the wavelengths absorbed.

As the capacity of Chinese ink to be wrote on various materials was generally known, the particular coating properties of photothermal carbon ink were investigated to compare it with standard pen ink. Parker® black pen ink was applied as a comparison. Both photothermal carbon ink and pen ink were coated on hydrophobic polypropylene membranes (FIG. 2F) and glass slides (FIG. 2E). In the case of photothermal carbon ink, no de-wetting or even shrinkage of the ink edge was observed; in stark contrast, significant de-wetting patterns appeared on the pen-ink-coated membrane and glass surfaces. Moreover, the adhesive and nanoparticles present in the photothermal carbon ink increase the viscosity, preventing its undesired diffusion caused by capillary effects in hydrophilic porous substrates. For example, when coating photothermal carbon ink and pen ink on hydrophilic melamine sponges, the pen ink was observed to infiltrate into the sponge, while the photothermal carbon ink stayed at the top of the sponge (FIG. 2F). This feature is advantageous for concentrating heat at the evaporation interface.

The photothermal carbon ink can be deposited on a substrate. In one embodiment, a traditional Chinese writing brush, such as made from animal hair (e.g., rabbit or weasel), is a preferred tool for the coating process because it can readily control the liquid release and transfer to achieve a uniform coating. Other types of brushes may be selected based on their ability to deposit a desired amount of ink. Further, mechanical or micromechanical/chemical processes, such as dip-coating and spin-coating, can be utilized.

The substrate is hydrophilic, porous and stable-in-water substrate. The substrate should be stable under the temperatures used for the ALD process described below. In one embodiment, the substrate is a thermal-insulating material. In various embodiments the substrate is a porous material such as membrane, sponge, fabric, or wood. In one embodiment, the substrate's pores form an interconnected network and are hydrophilic. In a further embodiment, the pores have a pore size of above 100 nm. In one embodiment, the substrate is a porous membrane. Other porous substrates may also be utilized. The ink is viscous so that it will not penetrate to block the pores, and even if the pores are covered by the ink coating (like the membrane), the water can transport through the spaces between the carbon particles. The membrane may be a typical commercially available membranes in some embodiments. In one embodiment the membrane may be hydrophilic imparted by one or more hydrophilic moieties. At least a portion of the hydrophilic moieties are positioned at the surface of the membrane. The membrane may comprise material selected from an organic polymer, such as PVDF, PP, PE, PTFE, nylon, CA, PAN, PC, PEEK, PI, PS, or PES. For membrane materials comprising a polar moiety, ALD may be performed directly. For membrane materials without a polar moiety (such as PP, PE, and PTFE), pretreatment with a plasma or other processing to enable deposition without the traditional covalent binding of the polar moiety with the first ALD precursor is done. Further, the membrane may be a composite material consisting of bulk membrane material and an additive. Where the additive is hydrophilic, serving as the hydrophilic moiety of the membrane (such as polyvinyl pyrrolidone ("PVP"), polyethylene glycol ("PEG"), piperazine, cellulose acetate phthalate ("CAP"), or malic acid), the membrane bulk may comprise a hydrophobic material (such as PVDF, PP, or PE). Preferably, the membrane is reactive with the selected ALD precursors. For example, one or both of the membrane bulk or the additive may be reactive with the first ALD precursor as described below. In one embodiment, the membrane has a disk shape and a diameter of about 47 mm and a thickness of ~200 microns. However, it should be appreciated that the size of the membrane may be scaled.

Having deposited the photothermal carbon ink onto the substrate, it is dried to form a solid photothermal carbon coating. The solid coating is then itself coated with a deposited coating. In one embodiment, a stabilizing coating is applied to the membrane, including within the pores. The coating may comprise $TiO_2$, $SnO_2$, $HfO_2$, $ZrO_2$, $SiO_2$, or $In_2O_3$. In one embodiment, the coating is $TiO_2$ or $SnO_2$. The coating may be deposited on a portion of the coating, such as one side or a portion of one side or may be deposited on the outer surface such that both sides of the membrane include the coating. The coating may be conformal to the pores (i.e., extending into the pores and coating a sidewall of the pores). Where the pores or coated, they may be coated uniformly throughout or may have a gradient of thickness. In one embodiment, the coating has a thickness of about 1-20 nm (including all-inclusive ranges therein), such as about 10 nm.

In one embodiment, the stabilizing coating is applied by ALD. ALD provides a reliable technology to fabricate conformal coatings on material surfaces. ALD is a chemically diverse vapor-phase deposition technique with the capability to synthesize ultra-thin and pinhole-free films (e.g., oxide barriers) with well-defined surface chemical control and precise physical thickness. While ALD is essentially a chemical vapor deposition ("CVD"), it is unique in that it can allow very high control for deposition of extremely thin layers (e.g., less than 1 nm thick layers) on the substrate. One or more precursors, (e.g., gaseous precursors) are inserted sequentially into the ALD chamber. The precursors interact in the ALD chamber to layer-by-layer deposit a film, layer, or otherwise coating (e.g., a metal oxide) on the substrate positioned in the ALD chamber over numerous insertion cycles. ALD enables layer-by-layer conformal growth. As described herein, the term "conformal" implies that the ALD deposited layer or coating conforms to the contours of structure on which it is deposited. In the case of a porous structure, the deposition occurs on the exposed surface, including within the pores (see, e.g., FIG. 1C). In another embodiment, sequential infiltration synthesis ("SIS") is used to deposit the stabilizing coating. SIS is a related deposition technique, similar to ALD in the use of precursor cycles. However, SIS differs notably from ALD in how the materials deposited are located relative to the substrate, where ALD deposited on a surface while SIS deposits in the surface and/or within the bulk of the substrate. It should be appreciated that SIS may be utilized in place of ALD, as described herein, where it is desired to deposit the stabilizing coating within the bulk of another material, which may be, for example, the substrate, the photothermal carbon coating, or a polymer masking or coating deposited on one or both of the photothermal coating and substrate.

In one embodiment, as further described below regarding the ALD methods, the oxide coatings are achieved through the use of a metal ALD precursor (first ALD precursor) and an oxidizing precursor (second metal precursor). For embodiments having a $TiO_2$ coating, the metal precursor may be titanium tetrachloride. For embodiments having a $SnO_2$ coating, the metal precursor may be tetrakis(dimethylamino) tin(IV). In one embodiment, the oxidizing precursor maybe be selected from water, oxygen, ozone, hydrogen peroxide, and combinations thereof. In one embodiment, the coating comprises $SiO_2$ and the first ALD precursor is (N,N-dimethylamino)trimethylsilane $(CH_3)_3SiN(CH_3)_2$, vinyltrimethoxysilane $CH_2=CHSi(OCH_3)_3$, trivinyl-methoxysilane $(CH_2=CH)_3SiOCH_3$, tetrakis(dimethylamino)silane $Si(N(CH_3)_2)_4$, or tris(dimethylamino)silane (TD-MAS) $SiH(N(CH_3)_2)_3$.

In one embodiment, a method of creating the oleophobic membrane, such as one shown in FIG. 1A, includes ALD deposition of the coating on the membrane. The membrane is positioned in an ALD reactor. The ALD reactor device includes a closed reaction chamber with the membrane positioned therein. As the membrane will typically be comprised of material with a low melting point, in some embodiments, the ALD process occurs at a temperature below 170° C. and above 40° C. (including ranges there between), such as below 150° C., below 125° C., between 110° C. and 90° C., at about 80 to 100° C. (+1-2° C.).

ALD proceeds with A subcycles (e.g., 1, 2, 3, 4, 5, 6, 7, 8, 9, 10 cycles or any other suitable subcycles) of a first ALD precursor. In a first ALD precursor subcycle, the first ALD precursor is introduced for a first period of time. The first ALD precursor reacts with the membrane. Specifically, the first ALD precursor diffuses through the reaction chamber and interacts with the surface of the membrane. The first ALD precursor forms a first half-step structure bonded to the membrane. Where an additive has been included in the membrane together with membrane bulk, the first ALD precursor may preferentially bind with one or the other. A plurality of such half-step structure are bonded where the first ALD precursor was exposed to the membrane. Optionally a first inert gas is used to purge the first ALD precursor.

ALD then proceeds with B subcycles (e.g., 1, 2, 3, 4, 5, 6, 7, 8, 9, 10 cycles or any other suitable cycles) of a second ALD precursor. The second ALD precursor is introduced for a second period of time. The second ALD precursor reacts with the first half-step structure to form the coating. Optionally a second inert gas is used to purge the second ALD precursor.

Exposure to the first ALD precursor and then exposure to the second ALD precursor constitutes one cycle resulting in deposited oxide material. A cycle may utilize multiple subcycles of first ALD precursor exposure and/or multiple subcycles of second ALD precursor exposure. Subsequent first ALD exposures may result in the first ALD precursor bonding with the coating to form additional layers (by reaction with the second ALD precursor) where the membrane is no longer exposed. An ALD cycle may be repeated (e.g., 10, 20, 30, 40, 50, 60, 70, 80, 90, 100, 140, 180, 200 cycles or any other suitable cycles) to deposit a coating of desired thickness, for example at least a complete coating (i.e., not islands or seeds).

Using ALD, the coating thickness can be precisely tuned at the nanometer scale by adjusting deposition parameters. Described herein are oxide-coated membranes by ALD.

Recent reports have shown that special designs of evaporation devices (such as cone, cup, and other 3D architectures) could enhance light absorption and promote the overall evaporation efficiency. The ink coating/ALD technology, as a surface-modifying process, can be implemented with a variety of substrate materials regardless of their form factor, enabling further promotion of energy efficiency and, eventually, commercialization of solar evaporation devices.

EXAMPLES

Experimental samples demonstrated a universal, stable photothermal coating for interfacial solar steam devices based on photothermal carbon ink stabilized with ALD. As shown below, photothermal carbon ink can be coated on the top surface of various substrates robustly and uniformly, even those with low surface energy or high porosity, and a $TiO_2$ ALD coating integrates the ink coating with the substrates to prevent the ink re-dispersing in the water. The photothermal carbon ink coating, composed of amorphous carbon nanoparticles and graphite-like nanoplatelets, exhibits strong and broad absorption from NIR to UV regions. It has excellent photothermal properties under simulated sunlight, and both photothermal carbon-ink-coated membranes and wood show superior evaporation performance relative to nascent water. All of these results indicate that photothermal carbon ink is a highly effective surface coating material, performing both sufficient spread on low-surface-energy substrates and limited capillary diffusion into porous substrates. Based on these results, it is believed that the ALD/photothermal carbon ink coating has the potential to achieve higher evaporation rate and efficiency by utilizing substrates with rough, structured surfaces and low thermal conductivity.

Fabrication of photothermal coatings: Chinese ink is a photothermal carbon material available commercially from Hukaiwen Ink Company (China). The PP and PVDF membranes were purchased from Sterlitech (USA) and MilliporeSigma (USA), respectively, and the melamine sponges and basswood were obtained from Fisher Scientific (USA). Titanium tetrachloride ("TTC"), the precursor for $TiO_2$ ALD, was obtained from Sigma-Aldrich (USA). A general fabrication process is described as follows. The Chinese ink was coated on various substrates by a writing brush. The thickness of ink coating was controlled by the ink volume. After drying in air, the samples were placed in an ALD reactor for $TiO_2$ deposition. ALD was conducted in a hot-walled, viscous flow reactor constructed by a circular stainless-steel tube with an internal diameter of 5 cm. All the experiments were performed at 100° C. using ultrahigh purity (99.999%) nitrogen carrier gas. The dose time of both TTC and water was 3 s and the purge time was 30 s. The ALD cycle number was 10, 20 and, 40 for the membranes, and increased to 100 for wood, sponges and fabrics.

Characterization

The microstructure observation and EELS of Chinese ink were performed on a TEM (JEOL). The surface morphologies and element distribution of the ink coatings were characterized by field emission scanning electron microscopy ("FESEM") (Hitachi). The infrared images were taken by a FTIL C2 Compact Thermal Imager. Both solution and solid NIR/UV-vis absorption and reflection spectra were detected by a NIR/UV-vis spectrometer (Lambda 950, PerkinElmer). Particle size distribution in Chinese ink solution was detected by a particle size analyzer (Zetasizer Nano, Malvern), and the surface wettability was evaluated by a contact angle test system (FM40, KRUSS). All the solar evaporation tests were conducted under a solar simulator (Oriel 300 W, Newport).

Figure 4A:
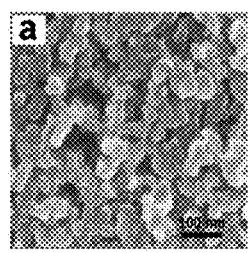
FIGS. 4A-D show SEM images of nascent materials and Chinese ink-coated materials before and after ALD.
Figure 4B:
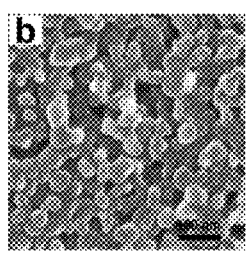
Figure 4C:
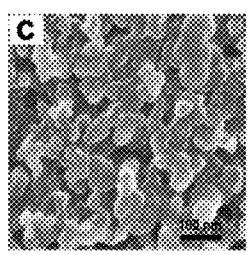
Figure 4D:
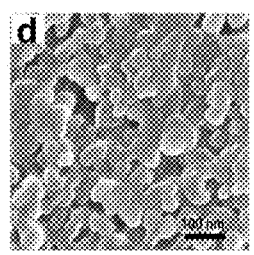
Figure 4E:
FIG. 4E shows energy dispersive spectroscopy ("EDS") mapping of the cross-section of a Chinese ink-coated PVDF membrane with $TiO_2$ ALD coating, with FIG. 4F showing carbon elemental mapping, FIG. 4G showing fluorine elemental mapping, and FIG. 4H showing titanium elemental mapping.
Figure 4F:
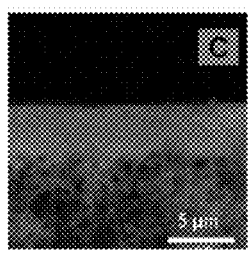
Figure 4G:
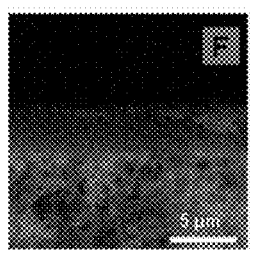
Figure 4H:
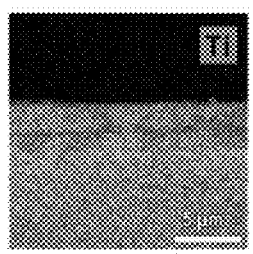

The surface morphologies of Chinese ink-coated PVDF membrane before and after $TiO_2$ ALD were observed by FESEM (FIGS. 4A-D). The nascent ink coating shows a porous structure comprised of stacked carbon nanoparticles. The particle size observed by SEM ranges from several tens of nanometers to one hundred nanometers, which increases slightly with increasing number of ALD cycles (the cycle numbers are 10, 20, and 40). The thickness of the ink coating is approximately 5 µm from observation of the membrane cross-section. EDS mapping results indicate the $TiO_2$ layer was uniformly deposited throughout the entire membrane, including both the ink coating and the PVDF substrate (FIG. 4E). This uniform, conformal $TiO_2$ coating formed on the Chinese ink-coated membrane acted as a "glue" to integrate the ink coating with the substrate for enhanced water stability.

Next, the optical properties of Chinese ink-coated membranes were investigated using a UV-vis/NIR spectrometer. The UV-vis spectrum of dispersed ink solution shows an increasing absorbance from visible to UV regions, similar to that of graphene oxide dispersions. An absorption peak appears at 260 nm, assigned to the electronic conjugation in graphite (FIG. 5A). The Chinese ink-coated membrane shows relatively low total reflectance, and the measured transmission is negligible. As a result, the light absorbance of Chinese ink-coated membranes is above 85% over the entire UV-vis-NIR range, which captures the vast majority of the spectrum of sunlight irradiation (FIG. 5B). ALD coating had an insignificant effect on the light absorption. It should be mentioned that the microfiltration membrane surface is relatively smooth on optical length scales, and the reflectance can therefore be further reduced by using substrates with macroscopically rough structures such as sponge and wood. Furthermore, the Raman spectrum reveals molecular details of the Chinese ink coating (FIG. 5C). The characteristic graphite band ("G-band") at ~1600 $cm^{-1}$ and defect band ("D-band") at ~1350 $cm^{-1}$ were observed, associated with the optically allowed $E_{2g}$ zone center mode of crystalline graphite and disorder-allowed zone-edge modes of graphite. Amorphous carbon composed of $sp^3$ and $sp^2$ bonding exhibits broad-band light absorption due to closely spaced energy levels of the loosely-held π electrons. As with optical properties, ALD coating shows no influence on the Raman spectrum.

Another essential property is the stability of ink coating in water. ALD is a reliable technology to construct thin, conformal layers on material surfaces with adjustable thickness. The vapor phase precursors easily diffuse into porous structures and form a conformal coating. Such coating can act as a "glue" to integrate carbon nanoparticles with the substrate and avoid undesired dispersion of ink in water. While ink-coated membranes without ALD readily release the ink into water, rendering them useless, these ALD/Chinese ink-coated membranes show significantly improved stability in water after even only 10 ALD cycles (FIG. 5D). A few apparent, insoluble black particles can be observed after vigorous shaking for the samples with fewer ALD cycles. The optimized number of ALD cycles is 40 for membrane samples in the current study. Enhanced surface wettability is another merit of the ink coating for solar evaporation. The ink coating is rendered highly hydrophilic because of the abundant hydroxyl groups on the $TiO_2$ surface. Water drops permeate through the ALD/Chinese ink-coated membrane within one second (FIG. 5E). This behavior is notably different from other carbon-based materials, which are commonly hydrophobic, especially for those with ordered aromatic structures. The intrinsic porous structure of the ink coating and PVDF membrane itself provides a connected capillary channel to transport water from the bottom to the top, which enhances the water supply during evaporation.

The evaporation performance of the ALD/Chinese ink-coated membranes was evaluated under simulated one sun illumination. As mentioned above, the water transports upward through the membrane to the surface with the ink coating based on capillary action (as shown in FIG. 6A). We selected the membrane as an example for evaporation performance evaluation. FIG. 6B compares the temperature rise on the water surface before and after simulated sunlight irradiation. The water in the beaker without a membrane shows a slight temperature increase from 21° C. to 30° C. due to infrared absorption, while the temperature rises from 21° C. to 45° C. for the beaker with a membrane. However, significant light reflection was observed under simulated sunlight due to the relatively smooth surface of the membrane. Moreover, a thin membrane is considered not ideal for interfacial heating because of its poor thermal insulation, which cannot prevent heat transfer from the surface to the bulk. These disadvantages compromise the evaporation performance of the ink-coated membrane. By contrast, wood has been reported as a preferred substrate for solar evaporation device fabrication. Wood is cellular, consisting of longitudinal cells and thin-walled cells located in the radial direction, providing numerous hydrophilic channels for water transport. It has good thermal insulating properties with a thermal conductivity of 0.1-0.2 W/m K. Conveniently, wood is also less dense than water and tends to float on the surface. Therefore, we applied ALD/Chinese ink-coated wood as a comparison (FIG. 6C). The surface temperature of the wood increased rapidly within the initial few minutes, and a significant temperature difference was observed between the surface and the bulk. The surface temperature increased to nearly 45° C. after 10 min, while the bulk temperature remained 25° C. The temperature gradient was maintained after 20 min irradiation despite the temperature increase in bulk water caused by both infrared absorption and thermal conduction. More detailed temperature evolution was monitored using an infrared temperature gun. As demonstrated in FIG. 6D, the surface temperature of both Chinese ink-coated membrane and wood increased rapidly at the initial stage. The surface temperature of wood reached 40° C. within 2 min, and slowly increased to an equilibrium temperature around 48° C., slightly higher than that of the membrane. In contrast, the water temperature increased slowly to nearly 30° C. The evaporation performance test was also conducted under simulated sunlight illumination (one sun intensity). Compared to the pure water (with an evaporation rate of 0.74 kg/m² h), the water evaporation rates with ALD/Chinese ink-coated membrane and wood are 2.4 (1.81 kg/m² h) and 4.2 (3.15 kg/m² h) times the nascent one, respectively (FIG. 6E). While the evaporation rate of nascent water is reported here as 0.74 kg/m² h, which is a little higher than that in other reports, this is believed to be the result of a result of low environmental humidity. It is difficult to directly compare the evaporation rate of interfacial and dispersed systems because the container depth impacts more significantly on the performance of dispersed system than that of interfacial one. Indeed, the dispersed materials are obviously inapplicable in open systems like rivers and ocean. The ALD/Chinese ink-coated wood showed stable evaporation performance with good reusability, indicating robust adhesion due to the ALD overcoating. Chinese calligraphy and paintings can be preserved for thousands of years due to the ultra-stability of Chinese ink, which also demonstrates the potential long-term stability in solar steam devices.

Definitions

As used herein, the singular forms "a," "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

The terms "coupled," "connected," and the like as used herein mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

What is claimed is:

1. A photothermal membrane comprising:
   a membrane having a porous network and comprising a bulk material having a hydrophilic moiety selected from the group consisting of polyvinylidene fluoride (PVDF), polypropylene (PP), polyethylene (PE), polytetrafluoroethylene (PTFE), nylon, cellulose acetate (CA), polyacrylonitrile (PAN), polycarbonate (PC), polyether etherketone (PEEK), polyimide (PI), polysulfone (PS), and polyethersulfone (PES);

a photothermal carbon coating comprising one or more of carbon nanoplatelets and carbon nanoparticles deposited on the membrane; and an oxide coating conformally disposed on the photothermal carbon coating, the oxide coating selected from the group consisting of $TiO_2$, $SnO_2$, $HfO_2$, $ZrO_2$, $SiO_2$, and $In_2O_3$.

2. The photothermal membrane of claim 1, wherein the membrane further comprises an additive consisting of polyvinyl pyrrolidone (PVP), polyethylene glycol (PEG), piperazine, cellulose acetate phthalate (CAP), or malic acid and wherein the hydrophilic moiety is a polar group of the additive.

3. The photothermal membrane of claim 1, wherein the oxide coating comprises $SiO_2$, $TiO_2$, or $SnO_2$.

4. The photothermal membrane of claim 1, wherein the porous network is hydrophilic.

5. The photothermal membrane of claim 1, wherein the photothermal carbon coating comprises carbon nanoplatelets and carbon nanoparticles.

6. A photothermal heating device comprising:

a substrate having a porous network and comprising a bulk material;

a photothermal carbon coating deposited on the substrate, the phototermal carbon coating comprising a nanocarbon material and an adhesive; and an oxide coating conformally disposed on the photothermal carbon coating, the oxide coating selected from the group consisting of $TiO_2$, $SnO_2$, $HfO_2$, $ZrO_2$, $SiO_2$, and $In_2O_3$.

7. The photothermal heating device of claim 6, wherein the photothermal carbon coating comprises carbon nanoplatelets and carbon nanoparticles.

8. The photothermal heating device of claim 6, wherein the adhesive is selected from the group consisting of carrageenan and gelatin.

* * * * *